United States Patent
Banka et al.

(10) Patent No.: US 9,317,638 B1
(45) Date of Patent: Apr. 19, 2016

(54) POLYMORPHIC CIRCUIT SIMULATION SYSTEM

(71) Applicant: Keysight Technologies, Inc., Minneapolis, MN (US)

(72) Inventors: Krishna Kumar Banka, Gurgaon (IN); Prantik Sarkar, Gurgaon (IN); Harald Devos, MariaKerke (BE); Peter Niday, Genoa, NV (US); John Robert Kenneth Lefebvre, II, Alpharetta, GA (US); Arbind Kumar, Gurgaon (IN); Atul Dubey, Gurgaon (IN)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 14/531,598

(22) Filed: Nov. 3, 2014

(51) Int. Cl.
*G06F 17/00* (2006.01)
*G06F 17/50* (2006.01)

(52) U.S. Cl.
CPC .......... *G06F 17/5022* (2013.01); *G06F 17/505* (2013.01)

(58) Field of Classification Search
CPC ................. G06F 17/5022; G06F 17/505
See application file for complete search history.

(56) References Cited

U.S. PATENT DOCUMENTS

| | | | | |
|---|---|---|---|---|
| 6,546,528 B1* | 4/2003 | Sasaki et al. | | 716/115 |
| 6,738,953 B1* | 5/2004 | Sabharwal et al. | | 716/103 |
| 6,915,249 B1* | 7/2005 | Sato et al. | | 703/14 |
| 7,093,206 B2* | 8/2006 | Anand et al. | | 716/115 |
| 7,206,731 B2* | 4/2007 | Sercu et al. | | 703/14 |
| 7,353,155 B2* | 4/2008 | Elfadel | | 703/13 |
| 7,735,048 B1* | 6/2010 | Zhang et al. | | 716/104 |
| 8,448,117 B2* | 5/2013 | Dai et al. | | 716/120 |
| 8,484,605 B2* | 7/2013 | Tan et al. | | 716/136 |
| 8,595,682 B2* | 11/2013 | Byrne et al. | | 716/137 |
| 8,667,455 B1* | 3/2014 | Ho | | 716/139 |
| 8,856,701 B1* | 10/2014 | Chen et al. | | 716/102 |
| 2007/0233443 A1* | 10/2007 | Lai et al. | | 703/14 |
| 2010/0070934 A1* | 3/2010 | Tan et al. | | 716/4 |
| 2010/0205572 A1* | 8/2010 | Dai et al. | | 716/5 |
| 2013/0159959 A1* | 6/2013 | Byrne et al. | | 716/137 |

* cited by examiner

*Primary Examiner* — Naum B Levin

(57) ABSTRACT

A method for operating a data processing system to simulate a circuit that includes a plurality of circuit devices connected by interconnects. A layout description of the circuit is provided in which the devices are connected by interconnects. Each interconnect is associated with a line definition that includes a physical description of an interconnect between two of the circuit devices and a simulation model to be used in simulating the interconnect during simulations of the circuit. The line definitions are user selectable from a list of available line definitions. A circuit netlist is generated by reading physical interconnects from the layout. At least one of the interconnects is replaced by a plurality of transmission line devices, each device being associated with the simulation model included in the line definition. The circuit is then simulated using the netlist.

14 Claims, 2 Drawing Sheets

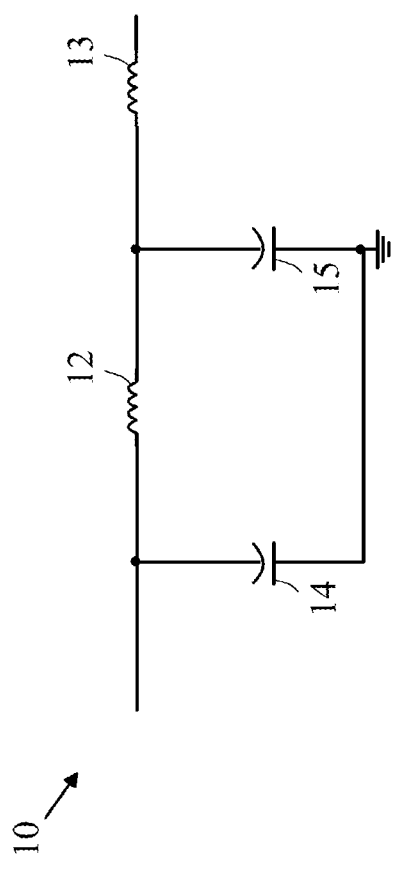
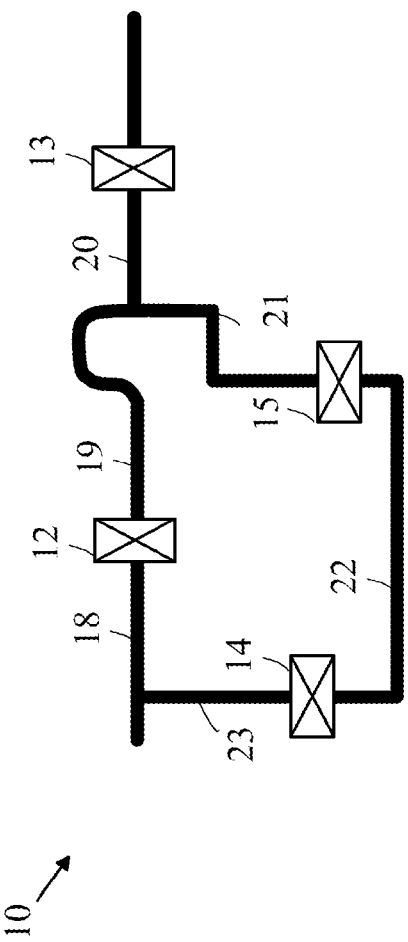

POLYMORPHIC CIRCUIT SIMULATION SYSTEM

BACKGROUND

Large scale integrated circuits are designed by first constructing an ideal circuit represented by a schematic in which the various components in the integrated circuit are connected by "wires" that merely short the corresponding connections on the components. Typically, a designer first constructs this ideal schematic and verifies the operation of the circuit using a circuit simulator. To simplify the following discussion, this schematic representation of the integrated circuit will be referred to as the ideal circuit schematic.

The circuit that is actually manufactured can differ significantly from the circuit shown in the ideal circuit schematic because the components are not connected by ideal wires. The problems introduced by the non-ideal connections are significant at the high operating frequencies involved in RF or microwave circuits and high-speed digital circuits.

Once the designer has verified the ideal circuit, the designer lays out the components on a suitable substrate and connects the components using interconnections that consist of polygons of conductive material that are joined together and may be coupled electrically to other nearby conductors. These interconnections will be referred to as "interconnects" in the following discussion. The interconnects are not ideal conductors. Hence, the conductors in the final circuit can have electrical properties that alter the behavior of the circuit as represented by the schematic, particularly at high frequencies. That is, the components are now connected by transmission lines that have electrical characteristics that can alter the behavior of the circuit represented by the ideal circuit schematic. Hence, the device in the layout is represented by a somewhat different schematic that takes the effects of the layout into consideration. To simulate the transmission line devices, a netlist that represents this different schematic must be generated.

Dealing with the modified/altered schematics presents challenges in that the process is not easily controlled by the designer. In one class of CAD tools, the CAD tool extracts the transmission line devices using a complex rule set. The designer must synchronize the schematic from the layout which adds the new devices extracted by the device extraction engine. This can be a tedious and error-prone process. In addition, it leads to an ideal circuit that has changed, and hence, the designer's original scheme is altered in a manner that is outside the direct control of the designer.

In some systems, the layout is altered by replacing the interconnects with the extracted devices. The changes in the layout make editing the layout during the design process difficult, as the interconnects cannot be easily edited without going back to the layout before the device extraction and repeating the device extraction on the entire circuit.

SUMMARY

The present invention includes a method for operating a data processing system to simulate a circuit that includes a plurality of circuit devices connected by interconnects. A layout description of the circuit is provided in which the devices are connected by interconnects. Each interconnect is associated with a line definition that includes a physical description of an interconnect between two of the circuit devices and a simulation model to be used in simulating the interconnect during simulations of the circuit. The line definitions are user selectable from a list of possible line definitions. A netlist is generated from the layout description. At least one of the interconnects is replaced by a plurality of transmission line devices, each device being associated with the simulation model included in the line definition. The circuit is then simulated using the netlist.

In one aspect of the invention, a circuit schematic description of the circuit is provided. The circuit schematic description includes a plurality of circuit devices, and the netlist includes the circuit devices from the circuit schematic description and transmission line devices corresponding to the interconnects from the layout description.

In another aspect of the invention, the simulation model associated with one of the line definitions is different from the simulation model for a different one of the line definitions.

In a still further aspect of the invention, the simulation model is chosen from the group consisting of a nodal short, an analytical transmission line model, an EM model, a model supplied in a Process Design Kit, and a coupled parallel line model.

In yet another aspect of the invention, a portion of the layout description is displayed on a display terminal and a user inputs information identifying one of the interconnects in the displayed portion of the layout description. The data processing system then alters the line definitions associated with the interconnect in response to user input.

In another aspect of the invention, at least one of the line definitions is user defined.

In yet another aspect of the invention, the line definition associated with one of the interconnects can be changed without changing the line definition associated with another of the interconnects.

BRIEF DESCRIPTION OF THE DRAWINGS

FIGS. 1A and 1B illustrate a portion of an integrated circuit and a layout of that portion of the integrated circuit.

DETAILED DESCRIPTION

Figure 2:
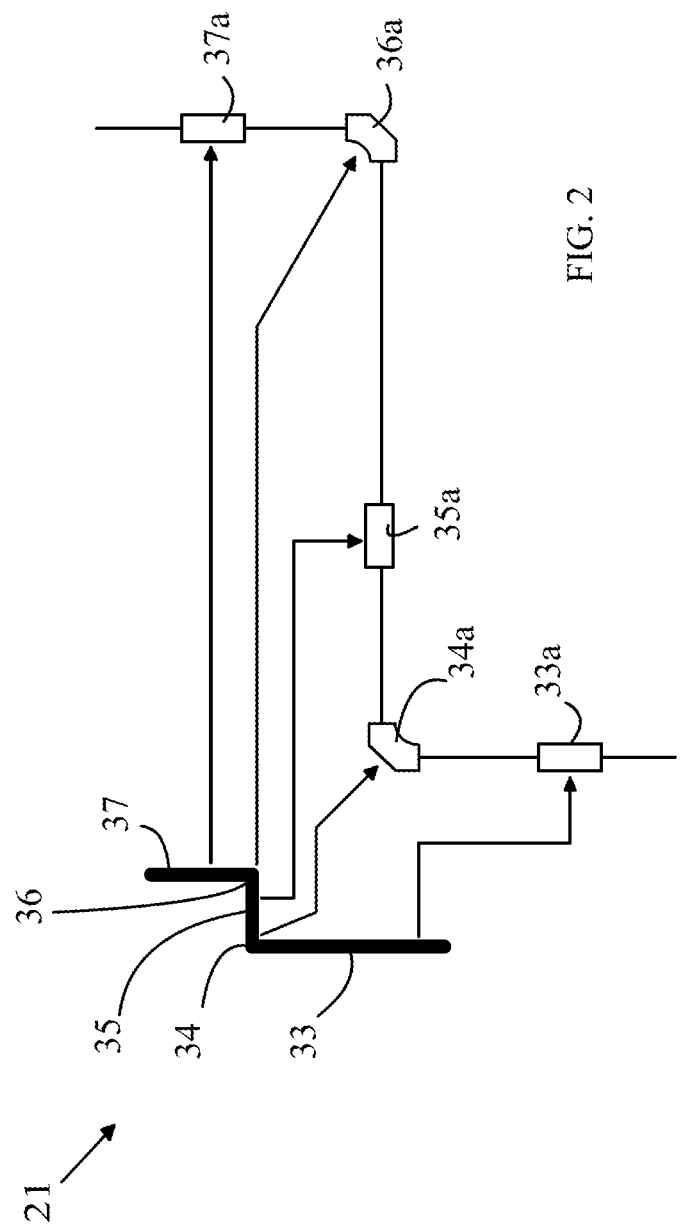
FIG. 2 illustrates the manner in which the present invention compiles an interconnect in the source layout view to a number of transmission line components from the family associated with the line definition for simulation.

In a CAD tool according to the present invention, the designer specifies the interconnects between components using line definitions. The interconnects are transformed into instances of transmission line components specified in the line definition. The line definitions take into account the geometry of the interconnect and the simulation model used for that interconnect during simulation. Since the interconnects are associated with line definitions by the designer, the function of the device extraction portion of the layout engine is not needed, as the layout only contains devices and interconnects that the designer inserted.

The present invention maintains a layout view of the integrated circuit in which the interconnects are associated with line definitions. This view will be referred to as the source layout view in the following discussion. For the purposes of the present discussion, an interconnect is defined to be a conducting path connecting two or more points. The path defines a locus of points that connect the two or more points. In addition, a "family" of devices is associated with the line definition. The family also specifies a simulation model to be used in simulating the devices within the family. The path is converted to one or more transmission line devices such as straight segments, and corners by the present invention prior to simulating the circuit. The present invention generates the netlist for the simulator by converting each interconnect in the layout to a sequence of transmission line components that executes the path indicated for that line and associates a simulation model with each component. The designer can edit the source layout view to change the path or line definition associated with any particular interconnect by selecting the interconnect and editing the path or the line definition associated with the path. The compilation of the source layout view to the netlist does not alter the source layout or the schematic, and hence, design iterations can easily be accomplished by editing either the source layout or the schematic.

In addition to editing the path of an interconnect, the designer can also change the line definition associated with that interconnect. By changing the associated line definition, the designer can alter the simulation model associated with the interconnect. The line definition defines both the physical structure of the interconnect and the simulation model associated with the components of that model. For example, a thick metal interconnect has a structure which is defined by conductors on multiple metal layers and vias connecting those conductors. A plurality of thick metal line definitions can be defined in which each family has the same physical structure but a different simulation model. The designer can change the line definition by identifying the interconnect and selecting the line definition from a list of defined line definitions. During the early stages of design optimization, the designer could pick a thick metal line definition with a computationally light workload to speed simulations. As the design is refined, the designer can change the line definition to the one that has a more computationally intense simulation model that provides more accurate results.

Similarly, if the simulations reveal that an interconnect is causing problems in the circuit, the designer can pick the interconnect in question and switch it to a different analytical model such as a micro-strip line by changing the line definition appropriately. The path of the line or its appearance in the source layout view does not change, except for the change in the simulation family associated with that interconnect.

Refer now to FIGS. 1A and 1B which illustrate a portion of an integrated circuit and a layout of that portion of the integrated circuit. Referring to FIG. 1A, circuit 10 includes two inductors shown at 12 and 13 and two capacitors shown at 14 and 15. The source layout view of the portion of circuit 10 shown in FIG. 1A is shown in FIG. 1B as it might be displayed on a display of the data processing system on which the present invention is running. The interconnects between the various components are shown at 18-23.

Refer now to FIG. 2, which illustrates the manner in which the present invention compiles an interconnect in the source layout view during netlisting to a number of transmission line components from the family associated with the line definition for simulation. FIG. 2 illustrates the conversion of the interconnect segment shown at 21 in FIG. 1B to transmission line devices according to the present invention. Segment 21 includes three straight sections shown at 33, 35, and 37 that are converted to straight transmission line devices shown at 33a, 35a, and 37a, respectively. The bends shown at 34 and 36 are represented by devices 34a and 36a, respectively. The present invention automatically converts the interconnect segment to the associated transmission line devices and generates the netlist associated with this expanded version of the layout. If, for example, it were determined that the bends in this transmission line family are causing unwanted reflections at high frequencies in the circuit simulation, the designer can display the portion of the layout containing the problematic interconnect on a display associated with the data processing system that is running the present invention and identify the interconnect in question using a suitable pointing device. The user can then alter the line definition associated with the interconnect to the one using a transmission line family which has bends that are more gradual and repeat the simulation.

The line definitions that are available to the designer can be provided by the fabrication facility in which the integrated circuit is to be built. The line definitions need only be constructed once for any particular fabrication process. Line definitions will differ in the physical attributes as well as the simulation model utilized which can be customized by the designer or the fabrication facility. In addition, a designer can construct custom line definitions that are particularly useful for some class of circuits that the design will be using multiple times.

In one aspect of the present invention, the simulation behavior of an interconnect can be chosen from five models. The simplest model is nodal short. In this model, the connection is treated as an ideal wire that shorts the device on each end of the interconnect. Line definitions with this simulation behavior impose the smallest computational workload. If all of the interconnects in the integrated circuit utilize line definitions with this simulation behavior, the simulation with interconnects from the layout should match that from the ideal schematic. This can provide a mechanism for verifying that the layout implements the ideal circuit schematic.

The second model is an analytical transmission line mode. Analytical models are mathematical models that have a closed form solution that is expressed as a set of parameterized formulas. These models have the advantage of being fast to evaluate. However, such models cannot be constructed for arbitrary physical structures, and hence, are typically limited to structures with a simple cross-section and a single dielectric such as micro-strip and stripline transmission lines.

The third model is referred to as an EM model. In this type of model, a large system of mathematical equations is constructed based on the geometry of the conducting layers and dielectrics. Solving this system takes much more time than evaluating the formulas of an analytical model. However, these models support arbitrary numbers of dielectric and conductor layers, and there are no restrictions on the parameter ranges.

The fourth class of models utilizes custom simulation behavior from a Process Design Kit. These are typically analytical models constructed for a specific fabrication technology and are provided by the fabrication facility or third parties. These can provide the most accurate simulations; however, the computational workload tends to be significantly higher.

The fifth class of models simulates coupled parallel lines of metal.

Any particular transmission line family includes a plurality of physical interconnect components such as straight line segments, right bends, left bends, etc. Each physical component includes relevant parameters such as a default width for the transmission line, radius of curvature for the bends, etc. In one aspect of the invention, these physical parameters are defined in a file that can be edited by the designer to create a new line definition that is derived from an existing line definition by modifying the parameters. This file also includes the simulation model associated with the family. The available line definitions are included in a library associated with CAD tools. The user can add one or more custom line definitions that are then available for the layout of the integrated circuit.

The above described embodiments have been directed to layouts for integrated circuits. However, the present invention can also be practiced with other forms of circuits by changing the library of transmission lines. For example, high frequency circuits fabricated on printed circuit boards can also be laid out using the present invention with an appropriate library of transmission line families.

The present invention provides a mechanism for using third-party proprietary simulation models which require paid licenses. The designer can layout and simulate the circuit design using non-proprietary simulation models in the early stages of the design optimization. If the results of the early simulations indicate that a more refined simulation is needed, line definitions utilized in the early states can be switched to those utilizing the proprietary simulation models.

The present invention can be practiced on a general purpose data processing system. The system preferably includes a user interface with a graphical display on which the layout can be displayed in sufficient detail to allow the user to select line definitions using an appropriate pointing device such as a mouse or stylus. The system can also utilize a remote computing facility to perform part of the computational work. For example, the generation of the netlist describing the current layout could be performed on a local computer. The netlist could then be transmitted to a remote processing system with sufficient hardware to perform the simulation in a shorter time. The remote facility could also be associated with the entity that provides proprietary simulation models. In this case, the proprietary simulation models can be more effectively protected.

The present invention also includes a computer readable medium that stores instructions that cause a data processing system to execute the method of the present invention. A computer readable medium is defined to be any medium that constitutes patentable subject matter under 35 U.S.C. 101 and excludes any medium that is not patentable subject matter under 35 U.S.C. 101. Examples of such media include non-transitory media such as computer memory devices that store information in a format that is readable by a computer or data processing system.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A method for operating a data processing system to simulate a circuit comprising a plurality of circuit devices connected by conductors, said method comprising:
   providing a layout description of said circuit in which said circuit devices are connected by interconnects, each interconnect being associated with a line definition comprising a physical description of an interconnect between two of said circuit devices and a simulation model to be used in simulating said interconnect during simulations of said circuit, said line definition being user selectable from a list of possible line definitions;
   causing a netlist to be generated from said layout description, wherein one of said interconnects is replaced by a plurality of transmission line devices, each transmission line device being associated with said simulation model included in said line definition; and
   causing said circuit to be simulated utilizing said netlist.

2. The method of claim 1 further comprising providing a circuit schematic description of said circuit, said circuit schematic description comprising a plurality of circuit devices, wherein said netlist comprises said circuit devices from said circuit schematic description and transmission line devices corresponding to the interconnects from said layout description.

3. The method of claim 1 wherein said simulation model associated with one of said line definitions is different from said simulation model for a different one of said line definitions.

4. The method of claim 1 wherein said simulation model is chosen from the group consisting of a nodal short, an analytical transmission line model, an EM model, a model supplied in a Process Design Kit, and a coupled parallel line model.

5. The method of claim 1 further comprising:
   displaying a portion of said layout description on a display terminal;
   receiving user input identifying one of said interconnects in said displayed portion of said layout description; and
   altering said line definitions associated with said interconnect in response to user input.

6. The method of claim 1 wherein one of said line definitions is user defined.

7. The method of claim 1 wherein said line definition associated with one of said interconnects can be changed without changing the line definition associated with another of said interconnects.

8. A computer readable medium comprising instructions that cause a data processing system to execute a method for operating a display that is part of said data processing system, said method comprising:
   providing a layout description of a circuit comprising a plurality of circuit devices in which said circuit devices are connected by interconnects, each interconnect being associated with a line definition comprising a physical description of an interconnect between two of said circuit devices and a simulation model to be used in simulating said interconnect during simulations of said circuit, said line definition being user selectable from a list of possible line definitions;
   causing a netlist to be generated from said layout description, wherein one of said interconnects is replaced by a plurality of transmission line devices, each transmission line device being associated with said simulation model included in said line definition; and
   causing said circuit to be simulated utilizing said netlist.

9. The computer readable medium of claim 8 further comprising providing a circuit schematic description of said circuit, said circuit schematic description comprising said plurality of circuit devices, wherein said netlist comprises said circuit devices from said circuit schematic description and transmission line devices corresponding to the interconnects from said layout description.

10. The computer readable medium of claim 8 wherein said simulation model associated with one of said line definitions is different from said simulation model for a different one of said line definitions.

11. The computer readable medium of claim 8 wherein said simulation model is chosen from the group consisting of a nodal short, an analytical transmission line model, an EM model, a model supplied in a Process Design Kit, and a coupled parallel line model.

12. The computer readable medium of claim 8 further comprising:
   displaying a portion of said layout description on a display terminal;
   receiving user input identifying one of said interconnects in said displayed portion of said layout description; and altering said line definitions associated with said interconnect in response to user input.

13. The computer readable medium of claim 8 wherein one of said line definitions is user defined.

14. The computer readable medium of claim 8 wherein said line definition associated with one of said interconnects can be changed without changing the line definition associated with another of said interconnects.

* * * * *